United States Patent
Kim et al.

(10) Patent No.: US 10,229,900 B2
(45) Date of Patent: Mar. 12, 2019

(54) SEMICONDUCTOR MEMORY DEVICE INCLUDING STACKED CHIPS AND MEMORY MODULE HAVING THE SAME

(71) Applicant: SAMSUNG ELECTRONICS CO., LTD., Suwon-si, Gyeonggi-do (KR)

(72) Inventors: Jong-Wan Kim, Suwon-si (KR); Sung-Chul Park, Seoul (KR); Won-Il Bae, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/693,707

(22) Filed: Sep. 1, 2017

(65) Prior Publication Data

US 2018/0158809 A1 Jun. 7, 2018

(30) Foreign Application Priority Data

Dec. 6, 2016 (KR) .................. 10-2016-0164946

(51) Int. Cl.
*G11C 5/02* (2006.01)
*H01L 25/18* (2006.01)
(Continued)

(52) U.S. Cl.
CPC .............. *H01L 25/18* (2013.01); *G11C 5/025* (2013.01); *G11C 5/04* (2013.01); *G11C 5/063* (2013.01); *G11C 7/1006* (2013.01); *H01L 25/0652* (2013.01); *H01L 25/0655* (2013.01); *H01L 25/0657* (2013.01); *H01L 2224/0401* (2013.01); *H01L 2224/04042* (2013.01); *H01L 2224/16145* (2013.01); *H01L 2224/16227* (2013.01); *H01L 2224/17181* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/49052* (2013.01); *H01L 2224/73207* (2013.01); *H01L 2224/73257* (2013.01);
(Continued)

(58) Field of Classification Search
CPC ....... G11C 5/063; G11C 7/18; G11C 11/4097; G11C 5/025; G11C 5/04
USPC ..................................................... 365/51, 63
See application file for complete search history.

(56) References Cited

U.S. PATENT DOCUMENTS

| | | | |
|---|---|---|---|
| 4,266,282 A | 5/1981 | Henle et al. | |
| 7,515,453 B2 * | 4/2009 | Rajan ..................... | G11C 7/10 365/63 |

(Continued)

*Primary Examiner* — Son Dinh
(74) *Attorney, Agent, or Firm* — F. Chau & Associates, LLC (57) ABSTRACT

A semiconductor memory device includes a memory structure including a first integrated circuit chip and a plurality of second integrated circuit chips stacked on each other, the first integrated circuit chip is interposed between a pair of the plurality of second integrated circuit chips, an interface unit disposed on the first integrated circuit chip, the memory structure is connected to a third circuit through the interface unit, and the interface unit transfers operation signals to the first integrated circuit chip and the plurality of second integrated circuit chips, at least one inter-chip interconnector connected with the interface unit and the first integrated circuit chip and the plurality of second integrated circuit chips, and an external interconnector connected with the interface unit and the third circuit.

20 Claims, 6 Drawing Sheets

(51) Int. Cl.
  *H01L 25/065*  (2006.01)
  *G11C 7/10*   (2006.01)
  *G11C 5/04*   (2006.01)
  *G11C 5/06*   (2006.01)

(52) U.S. Cl.
  CPC ............ *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06551* (2013.01); *H01L 2225/06562* (2013.01); *H01L 2225/06565* (2013.01); *H01L 2924/1431* (2013.01); *H01L 2924/1434* (2013.01); *H01L 2924/15311* (2013.01)

(56) References Cited

U.S. PATENT DOCUMENTS

| | | |
|---|---|---|
| 8,089,795 B2 * | 1/2012 | Rajan ............... G11C 7/1045 365/63 |
| 8,564,093 B2 | 10/2013 | Kuroda |
| 8,582,373 B2 | 11/2013 | Hollis |
| 8,787,060 B2 | 7/2014 | Lee |
| 8,885,380 B2 | 11/2014 | Kang et al. |
| 2011/0272788 A1 | 11/2011 | Kim et al. |
| 2015/0325560 A1 | 11/2015 | Fai et al. |
| 2016/0035698 A1 | 2/2016 | Lee et al. |
| 2016/0086923 A1 | 3/2016 | Best |

\* cited by examiner

SEMICONDUCTOR MEMORY DEVICE INCLUDING STACKED CHIPS AND MEMORY MODULE HAVING THE SAME

CROSS-REFERENCE TO RELATED APPLICATION(S)

This application claims priority under 35 U.S.C § 119 to Korean Patent Application No. 10-2016-0164946, filed on Dec. 6, 2016, in the Korean Intellectual Property Office, the disclosure of which is incorporated by reference herein in its entirety.

TECHNICAL FIELD

Exemplary embodiments of the inventive concept relate to a semiconductor memory device, and more particularly, to a semiconductor memory device including stacked chips and a memory module having the same.

DISCUSSION OF THE RELATED ART

Semiconductor packages are being manufactured to be small and to have a high capacity. The cost of manufacturing and process technologies may limit the semiconductor package capacity. Semiconductor chips (e.g., memory chips) may be stacked on each other to increase the capacity of a semiconductor package.

The stack of memory chips may include a master chip, in which an interface control circuit is provided for communications with other circuits, and a plurality of slave chips, connected with the master chip. When an external memory signal is transferred to a control circuit of the master chip, the master chip may transfer a control signal to each of the slave chips through inter-chip connectors in response to the memory signal.

The farther the slave chip is from the master chip, the longer the signal path of the control signal through the inter-chip connector between the master chip and the slave chip. A long signal path may lead to a signal delay and/or an increased power consumption.

The more slave chips are stacked in the memory device, the longer the signal delay and the higher the power consumption may be.

SUMMARY

According to an exemplary embodiment of the inventive concept, a semiconductor memory device includes a memory structure including a first integrated circuit chip and a plurality of second integrated circuit chips stacked on each other, wherein the first integrated circuit chip is interposed between a pair of the plurality of second integrated circuit chips, an interface unit disposed on the first integrated circuit chip, wherein the memory structure is connected to a third circuit through the interface unit, and wherein the interface unit transfers operation signals to the first integrated circuit chip and the plurality of second integrated circuit chips, at least one inter-chip interconnector connected with the interface unit and the first integrated circuit chip and the plurality of second integrated circuit chips, and an external interconnector connected with the interface unit and the third circuit.

According to an exemplary embodiment of the inventive concept, a memory module includes a circuit board including an internal circuit pattern and a contact terminal connected to an external circuit, a semiconductor memory device disposed on the circuit board, the semiconductor memory device including a plurality of integrated circuit chips stacked on the circuit board, and a memory controller disposed on the circuit board and controlling an operation of the semiconductor memory device. The semiconductor memory device includes a memory structure including the plurality of integrated circuit chips, wherein the plurality of integrated circuit chips includes a first integrated circuit chip and a plurality of second integrated circuit chips stacked on each other, wherein the first integrated circuit chip is interposed between a pair of the plurality of second integrated circuit chips, an interface unit disposed on the first integrated circuit chip, wherein the memory structure is connected to the external circuit through the interface unit, and wherein the interface unit transfers operation signals to the first integrated circuit chip and the plurality of second integrated circuit chips, at least one inter-chip interconnector connected with the interface unit and the first integrated circuit chip and the plurality of second integrated circuit chips such that operation signals between the first integrated circuit chip and the plurality of second integrated circuit chips pass through the at least one inter-chip interconnector, and a board connector connected with the interface unit and the circuit board such that operation signals between the memory structure and the circuit board pass through the board connector.

According to an exemplary embodiment of the inventive concept, a memory module includes a circuit board including a first surface, a second surface opposite to the first surface, at least one conductive pattern penetrating the circuit board between the first and second surfaces, and a contact terminal disposed on the second surface, wherein the contact terminal is connected to an external circuit and to the at least one conductive pattern, a semiconductor memory device disposed on the first surface of the circuit board, the semiconductor memory device including a plurality of integrated circuit chips, and a memory controller disposed on the circuit board and controlling an operation of the semiconductor memory device. The semiconductor memory device includes a memory structure including the plurality of integrated circuit chips, wherein the plurality of integrated circuit chips includes a first integrated circuit chip and a plurality of second integrated circuit chips stacked on each other, wherein the first integrated circuit chip is interposed between a pair of the plurality of second integrated circuit chips, an interface unit disposed on the first integrated circuit chip, wherein the memory structure is connected to the external circuit through the interface unit, and wherein the interface unit transfers operation signals to the first integrated circuit chip and the plurality of second integrated circuit chips, at least one inter-chip interconnector connected with the interface unit and the first and the second integrated circuit chips, and a board connector connected with the interface unit and the circuit board such that operation signals between the memory structure and the circuit board pass through the board connector.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Exemplary embodiment of the inventive concept will now be described more fully with reference to the accompanying drawings. Like reference numerals may refer to like elements throughout the specification.

Figure 1:
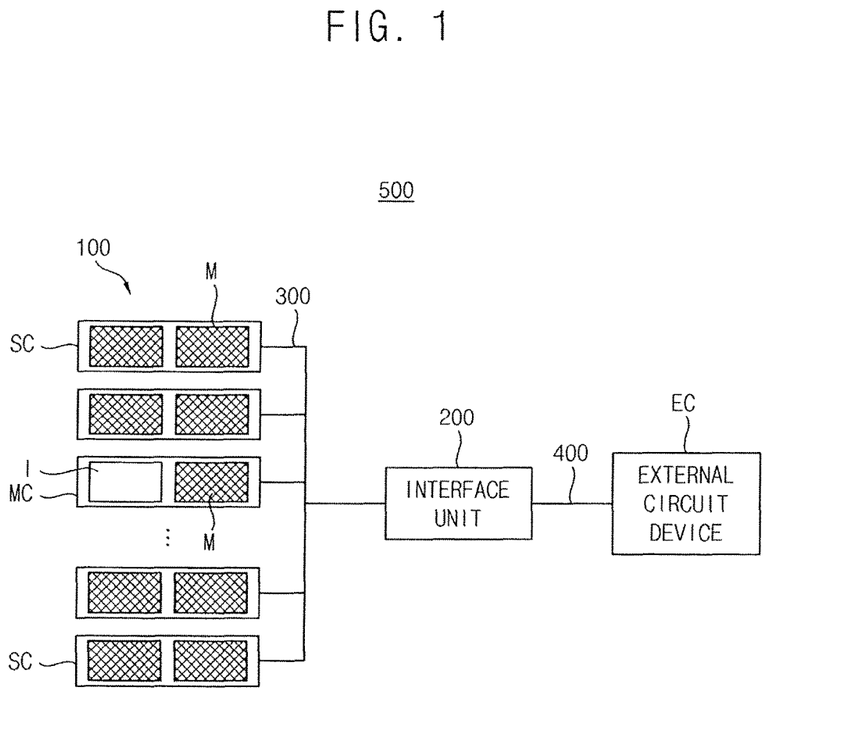
FIG. 1 is a diagram illustrating a semiconductor memory device according to an exemplary embodiment of the inventive concept.
Figure 2:
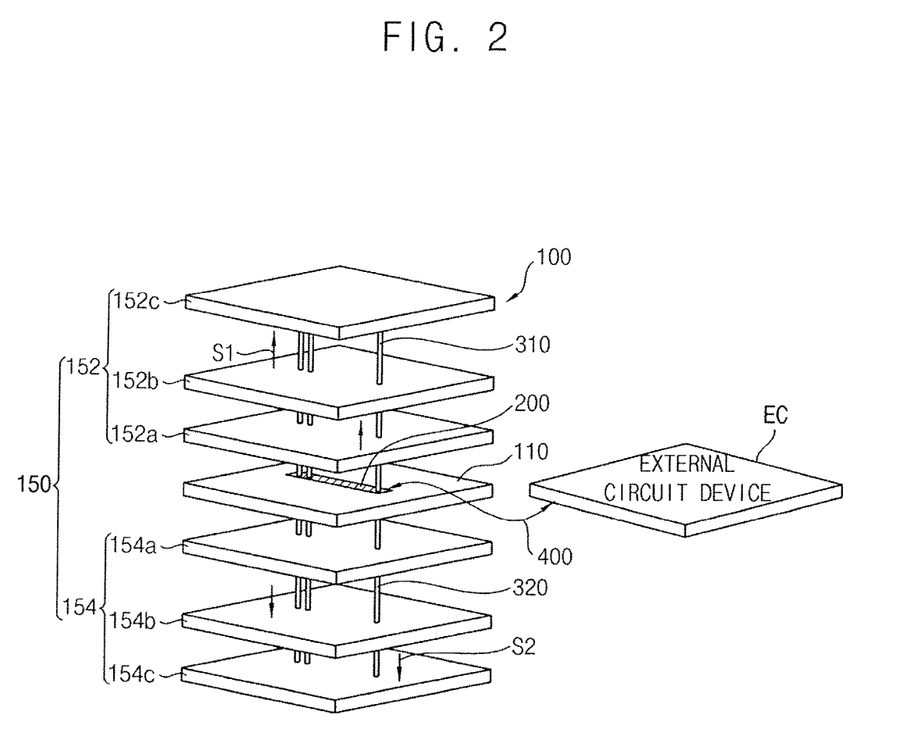
FIG. 2 is a perspective view illustrating the semiconductor memory device of FIG. 1, according to an exemplary embodiment of the inventive concept.

FIG. 1 is a diagram illustrating a semiconductor memory device according to an exemplary embodiment of the inventive concept. FIG. 2 is a perspective view illustrating the semiconductor memory device of FIG. 1, according to an exemplary embodiment of the inventive concept.

Referring to FIGS. 1 and 2, a semiconductor memory device 500, according to an exemplary embodiment of the inventive concept, may include a stack memory structure 100 having a single first integrated circuit chip 110 and a plurality of second integrated circuit chips 150, an interface unit 200 on the first integrated circuit chip 110, at least one inter-chip interconnector 300 connected with the interface unit 200 and the first and the second integrated circuit chips 110 and 150, and at least one external interconnector 400. The plurality of second integrated circuit chips 150 may be vertically stacked such that the first integrated circuit chip 110 is interposed between the second integrated circuit chips 150. The interface unit 200 may be used to transfer signals between the stack memory structure 100 and another circuit. In addition, the interface unit 200 may be used to transfer signals between the first and second integrated circuit chips 110 and 150. The at least one inter-chip interconnector 300 may be connected with the interface unit 200 and the first and the second integrated circuit chips 110 and 150 and may be used to transfer signals between the interface unit 200 and the first and the second integrated circuit chips 110 and 150. The at least one inter-chip interconnector 300 may be used as an internal signal path conveyor of the operation signals of the stack memory structure 100. The at least one external interconnector 400 may be connected with the interface unit 200 and the other circuit such that operation signals may be exchanged between the stack memory structure 100 and the other circuit.

The stack memory structure 100 may include a plurality of integrated chips that may be stacked or arranged in a predetermined direction. In an exemplary embodiment of the inventive concept, one first integrated circuit chip 110 may be interposed between a plurality of second integrated chips 150. Thus, the second integrated chips 150 may include a first memory group 152, that may be arranged at a first side of the first integrated circuit chip 110, and a second memory group 154, that may be arranged at a second side of the first integrated circuit chip 110.

The second integrated chips 150 may include an upper memory group that may be arranged on an upper side of the first integrated circuit chip 110 and a lower memory group that may be arranged under a lower side of the first integrated circuit chip 110. However, the second integrated chips 150 may include left and right memory groups that may be respectively arranged at left side and at a right side of the first integrated circuit chip 110.

The first integrated circuit chip 110 may include a master chip MC in which the interface unit 200 may be provided. Each second integrated circuit chip 150 may include a slave chip SC that may be connected to the first integrated circuit chip 110 through the inter-chip interconnector 300. Thus, the first and the second integrated chips 110 and 150 may be electrically connected with each other through the inter-chip interconnector 300 like a single chip assembly.

The first integrated circuit chip 110 may include an interface area I, in which the interface unit 200 may be arranged, and a memory area M, in which digital data may be stored.

The interface unit 200, having an interface control circuit, may be arranged in the interface area I. Operation signals from another circuit may be controlled and transferred to the stack memory structure 100 by using the interface unit 200.

A plurality of integrated chips may be arranged in the memory area M and binary data may be stored in cells of the integrated chips. The first integrated circuit chip 110 may include a volatile memory device such as a dynamic random access memory (DRAM) device and/or a non-volatile memory device such as a flash memory device.

The memory area M may be selectively disposed in the first integrated circuit chip 110. Thus, when no memory area M is disposed in the first integrated circuit chip 110, the first integrated circuit chip 110 may be a buffer master chip into which the binary data might not be stored. In this case, the operation signals may be transferred to the second integrated circuit chip 150 by the interface unit 200. The buffer master chip may include the interface unit 200 having an interface control circuit and/or a logic chip for controlling the stack memory structure 100.

The second integrated circuit chip 150 may include at least the memory area M and may include a volatile memory device such as DRAM device and/or a non-volatile memory device such as a flash memory device.

The interface unit 200 may be arranged on the first integrated circuit chip 110 and may control and transfer operation signals to the stack memory structure 100 from an external circuit device EC. The external circuit device EC may be, for example, a memory controller.

The interface unit 200 may include a control circuit that may be arranged on a pad area of the first integrated circuit chip 110 and an operation device for operating the control circuit. The interface unit 200 may communicate with other circuits through the pad area of the first integrated circuit chip 110. In addition, each of the second integrated circuits chips 110 may include a pad area.

The operation signals for the stack memory structure 100 may be applied to the interface unit 200 and may be processed by the control circuit of the interface unit 200. Then, the operation signals may be individually transferred by the interface unit 200 to the first and the second integrated circuit chips 110 and 150 through the inter-chip interconnector 300. The operation signals for the stack memory structure 100 may include address signals, data call signals, data transfer signals and various instruction signals to each of the first and the second integrated circuit chips 110 and 150.

The inter-chip interconnector 300 may connect the interface unit 200 and the first and the second integrated circuit chips 110 and 150 and may be used to transmit signals within the stack memory structure 100.

The inter-chip interconnector 300 may include a penetrating electrode and a bonding wire that may be connected to neighboring integrated circuit chips of the stack memory structure 100. Thus, the configurations and structures of the inter-chip interconnector 300 may be varied according to the configurations and structures of the stack memory structure 100.

Since the interface unit 200 may be disposed on the pad area of the first integrated circuit chip 110 and the inter-chip interconnector 300 may be connected to the pad area of each of the first and the second integrated circuit chips 110 and 150, the first and the second integrated circuit chips 110 and 150 may be sequentially connected to the interface unit 200 through the inter-chip interconnector 300.

Internal signals in the semiconductor memory device 500 and external signals for communicating with another circuit (e.g., an external system) may be controlled by the interface unit 200. Data reference signals for accessing the binary data in the stack memory structure 100 and data transfer signals for transferring data from the stack memory structure 100 to another circuit may be systematically controlled by the interface unit 200.

Since the interface unit 200 may be disposed on the first integrated circuit chip 110, and since the first integrated circuit chip 110 is interposed between a pair of the second integrated circuit chips 150, the inter-chip interconnector 300 may include first and second interconnector groups 310 and 320. The first interconnector group 310 may be connected with the first integrated circuit chip 110 and the first memory group 152, and the second interconnector group 320 may be connected with the first integrated circuit chip 110 and the second memory group 154. Since the second integrated circuit chips 150 may be sequentially vertically stacked or horizontally arranged, the first integrated circuit chip 110 and the second integrated circuit chips 152a to 152c of the first memory group 152 may be sequentially connected to each other by the first interconnector group 310 and may be connected to the first integrated circuit chip 110. In addition, the second integrated circuit chips 154a to 154c of the second memory group 154 may be sequentially connected to each other by the second interconnector group 320 and may be connected to the first integrated circuit chip 110.

Thus, a first operation signal S1 for operating the first memory group 152 may be transferred through the first interconnector group 310, and a second operation signal S2 for operating the second memory group 154 may be transferred through the second interconnector group 320 independently from the first operation signal S1. Accordingly, the length of the maximal signal path from the master chip MC to the slave chips SC may be reduced to a half of that of the conventional signal path. Thus, the transfer load of the inter-chip interconnector 300 in the semiconductor memory device 500 may be reduced.

The number and distribution of the inter-chip interconnectors 300 between the neighboring master chip MC and the slave chip SC or between the neighboring slave chips SC may be varied according to the configurations of the stack memory structure 100. The greater the number of the inter-chip interconnectors 300 disposed between neighboring chips, the shorter the length of the signal path from the master chip MC to the slave chips SC. Thus, the more the number of the slave chips SC that are connected to the master chip MC, the more the transfer load of the inter-chip interconnector 300 may be reduced. For example, the reduction of the transfer load of the inter-chip interconnector 300 may be large in a high capacity semiconductor memory device 500 (e.g., a semiconductor memory device 500 having a plurality of slave chips SC). Thus, the operation reliability of the semiconductor memory device 500 may be increased when the stack number of the integrated circuit chip is relatively large.

While FIGS. 1 and 2 illustrate three slave chips SC disposed on each of two opposite sides of the master chip MC, the number of slave chips SC on each of the two opposite sides of the master chip MC may be varied as needed. For example, the number of slave chips SC on each of the two opposite sides of the master chip MC may vary based on the memory capacity of the semiconductor memory device 500.

By placing the master chip MC in the middle of the second integrated circuit chips 150, the length of the signal path of the inter-chip interconnector 300 from the master chip MC to the uppermost slave chip 152c of the first memory group 152 may be reduced to a half of a length of the signal path of a conventional semiconductor memory device, in which the master chip MC is positioned at a bottom of a stack memory structure. Therefore, the transfer load of the inter-chip interconnector 300 may be reduced to about half of the transfer load of the conventional inter-chip interconnector. As described above, the larger the number of the inter-chip interconnectors 300 and the larger the number of the slave chips SC, the more the transfer load of the inter-chip interconnector 300 may be reduced.

The external interconnector 400 may be connected with the interface unit 200 and the external circuit device EC. The external interconnector 400 may provide a signal path between the stack memory structure 100 and the external circuit device EC. The external interconnector 400 may include a bonding wire or a bump structure that may be connected with the interface unit 200 and the external circuit device EC.

The structures and configurations of the external interconnector 400 may be varied according to the structures and configurations of the stack memory structure 100. Thus, the structure of the inter-chip interconnector 300 and the external interconnector 400 may be selected according to the structure and configuration of the stack memory structure 100.

When the stack memory structure 100 includes a plurality of vertically stacked integrated circuit chips, the inter-chip interconnector 300 may be a penetrating electrode such as a through silicon via (TSV), and the external interconnector 400 may be a bonding wire between the interface unit 200 and the external circuit device EC.

In an exemplary embodiment of the inventive concept, when the stack memory structure 100 includes a plurality of horizontally stacked integrated circuit chips, the inter-chip interconnector 300 may be a penetrating electrode such as a through silicon via (TSV), and the external interconnector 400 may be a bump structure between the interface unit 200 and the external circuit device EC.

In an exemplary embodiment of the inventive concept, when the stack memory structure 100 includes a plurality of stacked and shifted integrated circuit chips (e.g., a step-like stack of integrated circuit chips), the inter-chip interconnector 300 may be an inter-chip bonding wire that may be connected with pad areas of the neighboring chips, and the external interconnector 400 may include a board bonding wire between the interface unit 200 and the external circuit device EC.

According to an exemplary embodiment of the inventive concept, in the semiconductor memory device 500, the master chip MC having the interface unit 200 may be interposed between the slave chips SC, and the length of the signal path of the inter-chip interconnector 300 may be shortened. Thus, the signal transfer load of the inter-chip connector 300 may be reduced, and the operation reliability of the semiconductor memory device 500 may be increased.

The semiconductor memory device 500 may be mounted on a circuit board in various configurations and structures to manufacture various memory modules.

Figure 3:
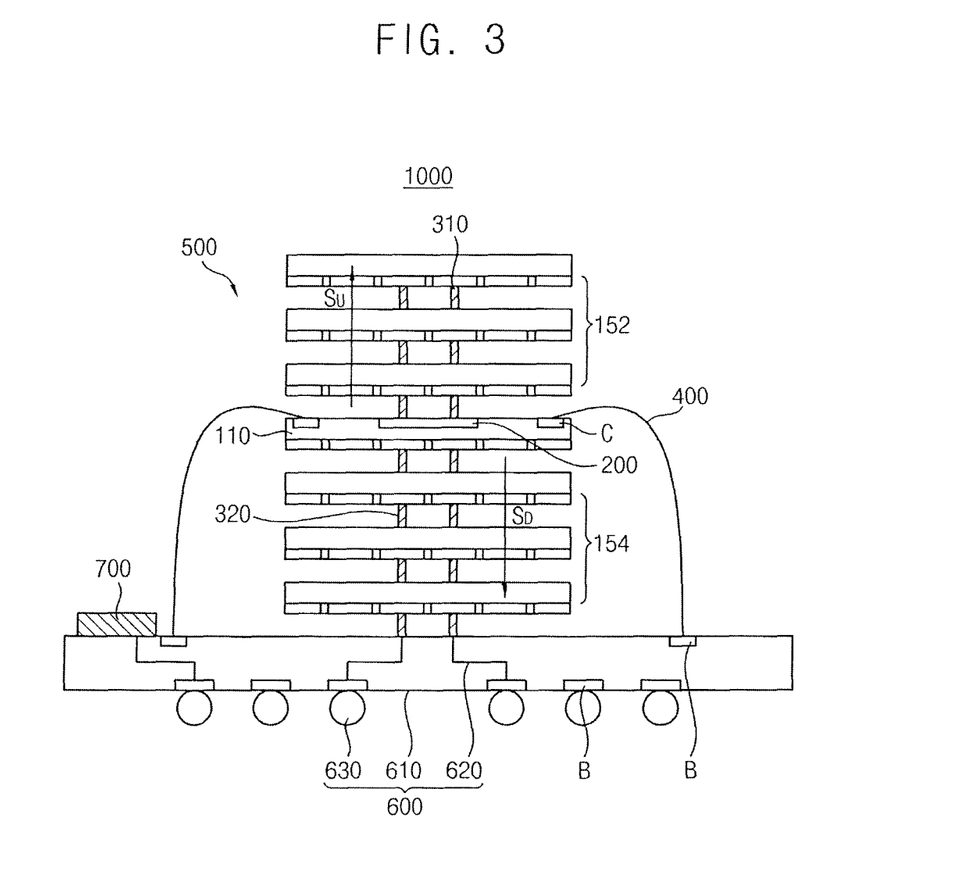
FIG. 3 is a cross-sectional view illustrating a memory module including the semiconductor memory device of FIGS. 1 and 2, according to an exemplary embodiment of the inventive concept.

FIG. 3 is a cross-sectional view illustrating a memory module including the semiconductor memory device of FIGS. 1 and 2, according to an exemplary embodiment of the inventive concept.

Referring to FIG. 3, a memory module 1000, according to an exemplary embodiment of the inventive concept, may include a circuit board 600 having an internal circuit pattern 620 and a contact terminal 630, at least one semiconductor memory device 500 disposed on the circuit board 600, and a memory controller 700 disposed on the circuit board 600. The contact terminal 630 electrically connects the memory module 1000 with another circuit. The circuit board 600 may include a plurality of integrated circuit chips that may be stacked on the circuit board 600. The memory controller 700 may control an operation of the semiconductor memory device 500.

The semiconductor memory device 500 of FIG. 3 may have substantially the same structures and configurations as the semiconductor memory device 500 of FIGS. 1 and 2. It is to be understood that where a description of an element in any of the drawings is not provided, the element which is not described may be similar to or identical to a corresponding element described elsewhere in the specification.

In an exemplary embodiment of the inventive concept, the first and the second integrated circuit chips 110 and 150 may be mounted on the circuit board 600 in a flip chip structure and the external interconnector 400 may be connected to a bonding pad B of the circuit board 600.

The first integrated circuit chip 110, which may be the master chip MC of the semiconductor memory device 500, may include the interface unit 200, for example, at a center portion of the first integrated circuit chip 110. The interface unit 200 may be connected to a contact pad C of the first integrated circuit chip 110. The inter-chip interconnector 300 may contact the interface unit 200 at the central portion of the first integrated circuit chip 110. The inter-chip interconnector 300 may include a penetrating electrode such as a TSV.

In an exemplary embodiment of the inventive concept, the first and the second integrated circuit chips 110 and 150 may be stacked on the circuit board 600. For example, the first and the second integrated circuit chips 110 and 150 may be vertically stacked so the edges of the first and the second integrated circuit chips 110 and 150 may be aligned with each other in a direction that is substantially perpendicular to a surface of the circuit board 600 on which the bonding pads B are disposed. Accordingly, the second integrated circuit chips 150 may include an upper memory group 152, arranged on an upper side of the first integrated circuit chip 110, and a lower memory group 154, arranged on a lower side of the first integrated circuit chip 110. The inter-chip interconnectors 300 may include an upper penetrating electrode 310, that may be connected with the first integrated circuit chip 110 and the upper memory group 152, and a lower penetrating electrode 320, that may be connected with the first integrated circuit chip 110 and the lower memory group 154.

The operation signals may be individually transferred to the upper and lower memory groups 152 and 154 from the interface unit 200, Thus, the signal path from the master chip MC to the uppermost/lowermost slave chip SC may be reduced.

The external interconnector 400 may include a board bonding wire (e.g., a board connector) that may be connected to the contact pad C of the first integrated circuit chip 110 and to a bonding pad B of the circuit board 600. Thus, the operation signals for operating the semiconductor memory device 500 may be applied to the circuit board 600 from another circuit and may reach the interface unit 200 under a control of the memory controller 700.

The circuit board 600 may include a plate body 610 having an electrically insulating material and a heat resistant material. The circuit board 600 may be flexible or rigid. A plurality of the internal circuit patterns 620 are disposed in the body 610, and a plurality of the contact terminals 630 may be arranged on a rear surface of the body 610 for communication with another circuit.

The body 610 of the circuit board 600 may include, for example, a thermosetting plastic such as an epoxy resin or polyimide. Alternatively, or additionally, the body 610 of the circuit board 600 may be a plate coated with a heat-resistive organic film such as a liquid crystal polyester film and a polyamide film. The internal circuit patterns 620 may be conductive lines or wirings disposed in the body 610. The internal circuit patterns 620 may include a power line for supplying an electric power, a plurality of signal lines for communicating data signals with the semiconductor memory device 500 and a ground line for electrically grounding the signal lines and the power line. The conductive lines or the wirings included in the internal circuit patterns 620 may be electrically insulated from one another by insulation layers. The circuit board 600 may include a printed circuit board (PCB) in which the circuit patterns 620 may be formed by a printing process.

The circuit patterns 620 may be connected to the bonding pads B of the body 610 so the semiconductor memory device 500 may be electrically connected to another circuit through the boding pads B and the internal circuit patterns 620.

The bonding pads B on an upper surface of the circuit board 600 may be connected to the contact pads C of the first integrated circuit chip 110, which may be connected to the interface unit 200. The bonding pads B on a rear surface of the circuit board 600 may be connected to the contact terminals 630, which may be connected to another circuit. The contact terminals 630 may include a plurality of solder balls. Thus, the memory module 1000 may have a ball grid array (BGA) structure for electrically connecting to another circuit.

The memory controller 700 may include an additional chip that may be mounted on the circuit board 600. Otherwise, the memory controller 700 may include an internal control circuit pattern that may be printed in the body 610 by a printing process.

Thus, the operation signals for operating the semiconductor memory device 500 may be applied to the contact terminals 630 from another circuit and may be under the control of the memory controller 700 via the internal circuit pattern 620. Then, the operation signals may be transferred to the interface unit 200 via the internal circuit patterns 620, the bonding pads B, the board bonding wires 400 and the contact pads C of the first integrated circuit chip 110.

The operations signals may include an upper operation signal $S_U$ that may be transferred to the upper memory group 152 and a lower operation signal $S_D$ that may be transferred to the lower memory group 154 according to the control characteristics of the memory controller 700. The upper and lower operation signals signal $S_U$ and $S_D$ may be individually transferred to the upper and lower memory groups 152 and 154 by the interface unit 200.

The data signals for transferring the binary data of the semiconductor memory device 500 may be transferred to the interface unit 200 through the penetrating electrode 300, and may be modulated into common data signals that may be communicated with another circuit by the interface unit 200. Then, the common data signals may be transferred to the memory controller 700 by the interface unit 200.

The memory controller 700 may include a chip selector for selecting a chip from the stack memory structure 100 based on a chip address map, a refresh signal generator for sequentially generating refresh signals in response to refresh instructions and a signal analyzer, analyzing the signals and selecting a signal transfer mode between the penetrating electrode 300 and the board bonding wire 400.

Therefore, the memory controller 700 may control the operation signals, which may be applied to the semiconductor memory device 500, and the data signals, which may be transferred from the semiconductor memory device 500 in such a way that the memory module 1000 may be systematically in communication with another circuit.

While in FIG. 3 it is shown that a single semiconductor memory device 500 is disposed on the circuit board 600, it is understood that a plurality of the semiconductor memory devices 500 may be disposed on the circuit board 600 depending on the memory capacity and/or the operation performance of the memory module 1000.

According to an exemplary embodiment of the inventive concept, in the memory module 1000, the master chip MC may be interposed between the slave chips SC and thus the length of the signal path of the penetrating electrode 300 may be shortened. Thus, the signal transfer load of the penetrating electrode 300 in the memory module 1000 may be reduced, and the operation reliability of the memory module 1000 may be increased.

The number of the penetrating electrodes 300 may be increased depending on the signal transfer mode between the penetrating electrode 300 and the board bonding wire 400, the data transfer rate of the penetrating electrode 300 and the number of the integrated circuit chips stacked in the stack memory structure 100. The greater the number of the penetrating electrodes 300, the lower the signal transfer load of the penetrating electrodes 300. Thus, the reduction of the signal transfer load may increase in the memory module 1000 when the memory capacity of the memory module 1000 increases.

Figure 4:
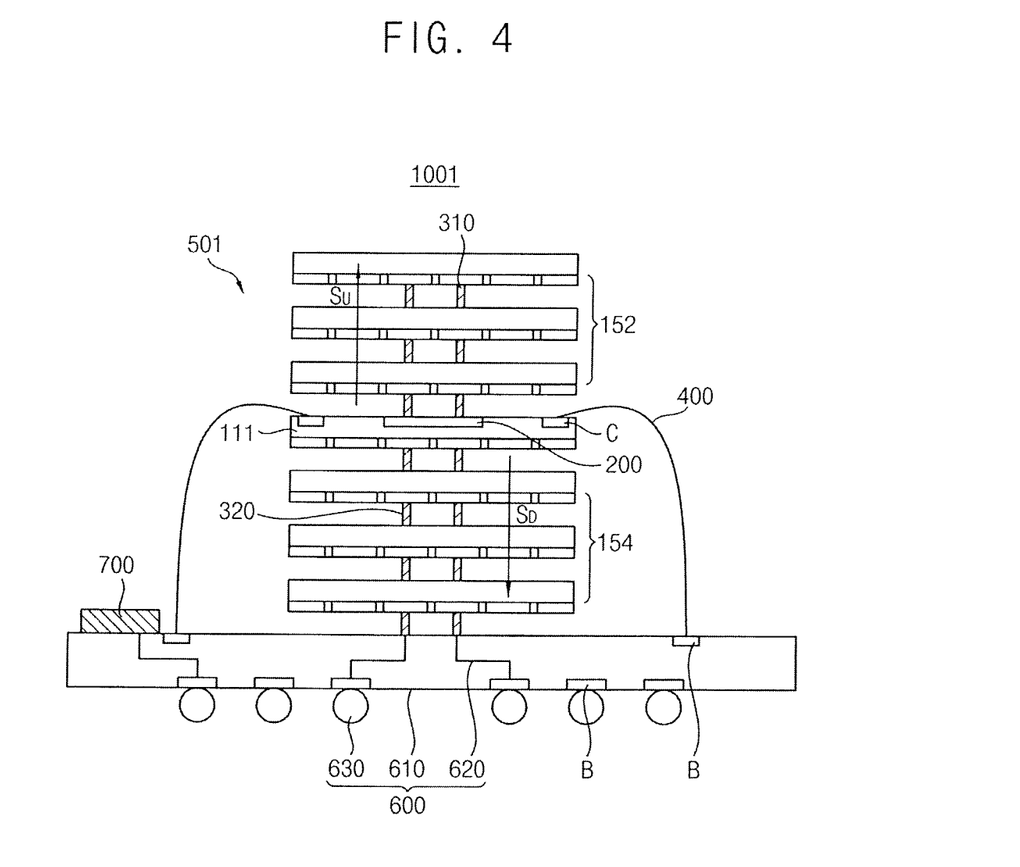
FIG. 4 is a cross-sectional view illustrating a memory module including the semiconductor memory device of FIGS. 1 and 2, according to an exemplary embodiment of the inventive concept.

FIG. 4 is a cross-sectional view illustrating a memory module including the semiconductor memory device of FIGS. 1 and 2, according to an exemplary embodiment of the inventive concept. In FIG. 4, a memory module 1001 has substantially the same structures as the memory module 1000 shown in FIG. 3, except that the master chip MC includes the interface unit 200 without the memory unit M.

Referring to FIG. 4, a memory module 1001 may include a semiconductor memory device 501, including one first integrated circuit chip 111 and a plurality of second integrated circuit chips 150 mounted on the circuit board 600. The first integrated circuit chip 111 may include the interface unit 200 at a center portion thereof and might not include the memory unit M. The second integrated circuit chips 150 may include the memory unit M and might not include the interface unit 200. The first integrated circuit chip 111 may be interposed between the second integrated circuit chips 150 in the semiconductor memory device 501. Thus, the first integrated circuit chip 111 may be a buffer master chip MC, and each of the plurality of second integrated circuit chips 150 may be a slave chip SC in the semiconductor memory device 501.

Accordingly, the first integrated circuit chip 111 may have various configurations and structures as long as only the interface unit 200 may be disposed on the first integrated circuit chip 111 without the memory unit M, and the first integrated circuit chip 111 may be interposed between the second integrated circuit chips 150.

When the first integrated circuit chip 111 has the same size as the second integrated circuit chips 150, and the interface area I occupies the entire area of the first integrated circuit chip 111, an increased number of various control circuits may be disposed on the first integrated circuit chip 111. For example, an additional number of circuits may be disposed in the interface unit 200. Thus, the interface unit 200 may conduct an increased number of operations. In an exemplary embodiment of the inventive concept, the interface unit 200 may further include some elements of the memory controller 700 such as the refresh signal generator and the signal analyzer.

In addition, an additional control chip for controlling the operation of the semiconductor memory device 501 may be combined with (e.g., added to) the first integrated circuit chip 111. For example, an additional logic chip for controlling the operation of the second integrated circuit chips 150 may be further disposed on the first integrated circuit chip 111. When the second integrated circuit chip 150 includes memory devices such as a dynamic random access memory (DRAM) device and/or a flash memory device, the first integrated circuit chip 111, having the logic chip, may be a logic device for controlling the memory devices. For example, the logic device may supplement the memory controller 700.

While FIG. 4 discloses that the buffer master chip 111 may have the same size as the slave chips SC, it is to be understood that the size of the buffer master chip 111 may be smaller than that of the slave chips SC as long as the needed circuitry can be fit in area of the interface unit 200.

Figure 5:
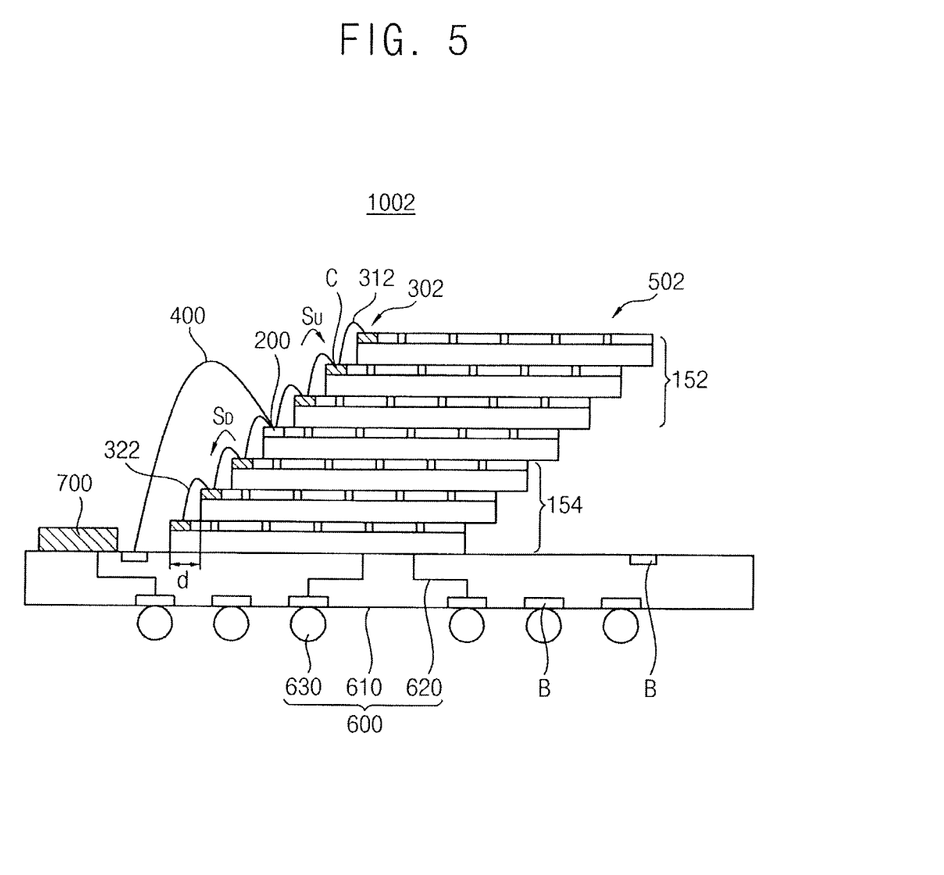
FIG. 5 is a cross-sectional view illustrating a memory module including the semiconductor memory device of FIGS. 1 and 2, according to an exemplary embodiment of the inventive concept.

FIG. 5 is a cross-sectional view illustrating a memory module including the semiconductor memory device of FIGS. 1 and 2, according to an exemplary embodiment of the inventive concept. In FIG. 5, a memory module 1002 has substantially the same structures as the memory module 1000 shown in FIG. 3, except that the master chip MC and the slave chips SC may be shifted on the circuit board into a cascade structure (e.g., in a step-like stack). Thus, a bonding wire is provided as the inter-chip interconnector 300. Thus, in FIG. 5, like reference numerals may denote like elements described with reference to FIG. 3, and any further detailed descriptions thereof may be omitted.

Referring to FIG. 5, a memory module 1002 may include a semiconductor memory device 502 in which a single of first integrated circuit chip 110 and a plurality of second integrated circuit chips 150 may be vertically stacked on the circuit board 600. The first and the second integrated circuit chips 110 and 150 may be mounted on the circuit board in such a configuration that an active face of each chip 110 and 150 may face upwards (e.g., away from the circuit board 600) and each chip may be shifted along an upper surface of the circuit board 600 by the same shift distance d with respect to the neighboring chip. Thus, the stack memory structure 100 may be shaped into the cascade structure and a pair of the neighboring chips may constitute a step in which an edge portion of the active face of the chips 110 and 150 may be exposed.

In an exemplary embodiment of the inventive concept, the first and the second integrated circuit chips 110 and 150 may include an edge in which the contact pad C and the interface unit 200 may be disposed in such a way that the interface unit 200 may make contact with the contact pad C of each chip 110 and 150.

Each of the first and the second integrated circuit chips 110 and 150 may be vertically stacked on the circuit board 600 into the cascade structure such that the contact pad C of each chip 110 and 150 may be exposed and be connected with each other by an inter-chip bonding wire 302. Thus, the contact pads C of the second integrated circuit chips 152a to 152c of the upper memory group 152 may be connected with each other by an upper inter-chip bonding wire 312 and the contact pads C of the second integrated circuit chips 154a to 154c of the lower memory group 154 may be connected with each other by a lower inter-chip bonding wire 322. The upper and the lower inter-chip bonding wires 312 and 322 may be individually connected to the contact pad C of the first integrated circuit chip 110.

Therefore, the operation signals may be separated into an upper operation signal $S_U$ and a lower operation signal $S_D$ that may be individually transferred to the upper memory group 152 and the lower memory group 154 through the upper and lower inter-chip bonding wires 312 and 322, respectively. For example, the operation signal may include the upper and lower operation signals $S_U$ and $S_D$ and may be individually transferred through the respective inter-chip bonding wires 312 and 322 independently from each other, thus minimizing the length of the signal path from the interface unit 200 to the uppermost/lowermost slave chips SC.

The external interconnector 400 may include the board bonding wire that may be connected with the contact pad C of first integrated circuit chip 110 and the bonding pad B of the circuit board 600. Thus, the operation signal may be applied to the circuit board 600 by another circuit and then may be transferred to the interface unit 200 through the board bonding wire 400 under the control of the memory controller 700.

The board bonding wire 400, the circuit board 600 and the memory controller 700 may have substantially the same structures as the memory module 1000 shown in FIG. 3. An aligning guide may be further disposed in the memory module 1002 to prevent a misalignment of the first and the second integrated circuit chips 110 and 150 and the cut-off (e.g., disconnection) of the upper and lower inter-chip bonding wires 312 and 322.

Figure 6:
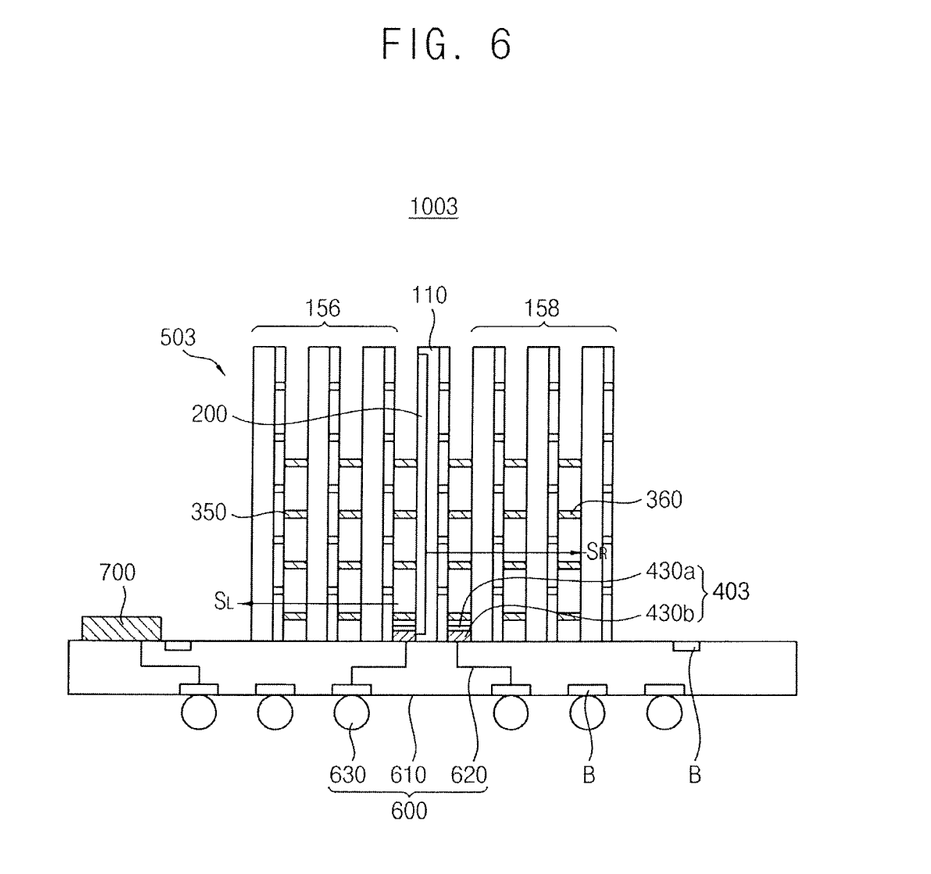
FIG. 6 is a cross-sectional view illustrating a memory module including the semiconductor memory device of FIGS. 1 and 2, according to an exemplary embodiment of the inventive concept.

FIG. 6 is a cross-sectional view illustrating a memory module including the semiconductor memory device of FIGS. 1 and 2, according to an exemplary embodiment of the inventive concept. In FIG. 6, a memory module 1003 has substantially the same structures as the memory module 1000 shown in FIG. 3, except that the master chip MC and the slave chips SC may be arranged substantially vertically on the circuit board 600, as shown in FIG. 6. The master chip MC and the slave chips SC may be spaced apart from each other along an upper surface of the circuit board 600. Thus a bump structure may be provided as the external interconnector 400.

Referring to FIG. 6, a memory module 1003 may include a semiconductor memory device 503 in which a single of first integrated circuit chip 110 and a plurality of second integrated circuit chips 150 may be arranged on the circuit board 600 in parallel with each other along the upper surface of the circuit board 600 and substantially perpendicular to the upper surface of the circuit board 600. Thus, the first and second integrated circuit chips 110 and 150 may be arranged on the circuit board 600 in such a way that the first integrated circuit chip 110, functioning as the master chip MC, may be interposed between the second integrated circuit chips 150, functioning as the slave chips SC.

The interface unit 200 may be arranged on the first integrated circuit chip 110 and the neighboring second integrated circuit chips 150 and the interface unit 200 and the second integrated circuit chips 150 may be connected with each other through a penetrating electrode 300. The interface unit 200 may be connected to the internal circuit pattern 620 or the bonding pad B through the external interconnector 400.

The second integrated circuit chips 150 may include a left memory group 156 that may be arranged at a left side of the first integrated circuit chip 110 and a right memory group 158 that may be arranged at a right side of the first integrated circuit chip 110. In addition, the penetrating electrodes 300 may include a left penetrating electrode 350, that may be connected with the first integrated circuit chip 110 and the left memory group 156, and a right penetrating electrode 360, that may be connected with the first integrated circuit chip 110 and the right memory group 158.

Therefore, the operations signals may include a left operation signal $S_L$ that may be transferred to the left memory group 156 and a right operation signal $S_R$ that may be transferred to the right memory group 158 according to the control characteristics of the memory controller 700. The left and right operation signals signal $S_L$ and $S_R$ may be individually transferred to the left and right memory groups 156 and 158 by the interface unit 200, thus minimizing the length of the signal path of the penetrating electrode from the interface unit 200 to a rightmost/leftmost slave chip SC.

The external interconnector 400 that may be connected with the interface unit 200 and the circuit board 600 may include a bump structure 403 that may be connected with the bonding pad B of the circuit board 600 and the contact pad C of the first integrated circuit chip 110. The bump structure 403 may also be connected to the interface unit 200 together with or in place of the contact pad C of the first integrated circuit chip 110. The bump structure 403 may be disposed in the left and/or right side of the first integrated circuit chip 110.

The bump structure 403 may include a bump pad 403a and conductive bump 403b that may be interpose between the bump pad 403a and the bonding pad B of the circuit board 600. The bump pad 403a may be disposed on an active face and/or a rear face of the first integrated circuit chip 110 such that the bump pad 403a may make contact with the contact pad C of the first integrated circuit chip 110 and may be insulated from the left and right penetration electrodes 350 and 360. A master contact area may be provided on the circuit board 600, and the semiconductor memory device 503 may be mounted on the circuit board 600 in such a way that the bump structure 403 may be aligned with the master contact area.

Thus, the operation signal may be applied to the circuit board 600 by another circuit and then may be transferred to the interface unit 200 through the bump structure 403 under the control of the memory controller 700.

The disclosed memory modules 1000 to 1003 may be mounted on a motherboard of various electronic systems and may be a memory member of the electronic system. The memory modules 1000 to 1003 may be provided as a memory system for a desktop computer, a notebook computer, a server system, a mobile system such as a smartphone, etc.

In the semiconductor memory device 500 and the memory modules 1000 to 1003 including the same, the master chip MC having the interface unit 200 may be interposed between the slave chips SC in the semiconductor memory device. Thus, the length of the signal path of the inter-chip interconnector 300 may be shortened. Thus, the signal transfer load of the inter-chip connector 300 may be reduced in the stack memory structure. Accordingly, the operation reliability of the semiconductor memory device 500 may be increased.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. A semiconductor memory device comprising:
   a memory structure including a first integrated circuit chip, configured to store digital data, and a plurality of second integrated circuit chips, each of which is configured to store digital data, stacked on each other, wherein the first integrated circuit chip is interposed between a pair of the plurality of second integrated circuit chips;
   an interface unit disposed on the first integrated circuit chip, wherein the memory structure is connected to a third circuit through the interface unit, and wherein the interface unit transfers operation signals to the first integrated circuit chip and the plurality of second integrated circuit chips;
   at least one inter-chip interconnector connected with the interface unit and the first integrated circuit chip and the plurality of second integrated circuit chips; and
   an external interconnector connected with the interface unit and the third circuit.

2. The semiconductor memory device of claim 1, further comprising a plurality of inter-chip interconnectors, wherein the plurality of second integrated circuit chips includes a first memory group, arranged at a first side of the first integrated circuit chip, and a second memory group, arranged at a second side of the first integrated circuit chip, and wherein the plurality of inter-chip interconnectors includes a first interconnector group, connecting the first integrated circuit chip with the first memory group, and a second interconnector group, connecting the first integrated circuit chip with the second memory group.

3. The semiconductor memory device of claim 2, wherein the plurality of inter-chip interconnectors includes a penetration electrode, and wherein the external interconnector includes a bonding wire that is connected to the interface unit.

4. The semiconductor memory device of claim 2, wherein the plurality of inter-chip interconnectors includes a penetration electrode, and wherein the external interconnector includes a conductive bump that is connected to the interface unit.

5. The semiconductor memory device of claim 4, wherein the plurality of inter-chip interconnectors includes an inter-chip bonding wire, and wherein the external interconnector includes a substrate bonding wire that is connected to the interface unit.

6. The semiconductor memory device of claim 1, wherein the first integrated circuit chip includes a master chip, the master chip including the interface unit and a memory unit for storing data, and wherein each of the plurality of second integrated circuit chips includes a slave chip, the slave chip including a memory unit for storing data.

7. The semiconductor memory device of claim 1, wherein the first integrated circuit chip includes a buffer master chip, the buffer master chip including the interface unit therein, wherein the first integrated circuit excludes a memory unit, and wherein each of the plurality of second integrated circuit chips includes a slave chip, the slave chip including a memory unit for storing data.

8. A memory module comprising:
   a circuit board including an internal circuit pattern and a contact terminal connected to an external circuit;
   a semiconductor memory device disposed on the circuit board, the semiconductor memory device including a plurality of integrated circuit chips stacked on the circuit board; and
   a memory controller disposed on the circuit board and controlling an operation of the semiconductor memory device,
   wherein the semiconductor memory device includes:
   a memory structure including the plurality of integrated circuit chips, wherein the plurality of integrated circuit chips includes a first integrated circuit chip and a plurality of second integrated circuit chips stacked on each other, wherein the first integrated circuit chip is interposed between a pair of the plurality of second integrated circuit chips;
   an interface unit disposed on the first integrated circuit chip, wherein the memory structure is connected to the external circuit through the interface unit, and wherein the interface unit transfers operation signals to the first integrated circuit chip and the plurality of second integrated circuit chips;
   at least one inter-chip interconnector connected with the interface unit and the first integrated circuit chip and the plurality of second integrated circuit chips such that operation signals between the first integrated circuit chip and the plurality of second integrated circuit chips pass through the at least one inter-chip interconnector; and
   a board connector connected with the interface unit and the circuit board such that operation signals between the memory structure and the circuit hoard pass through the board connector.

9. The memory module of claim 8, wherein planes along which the first integrated circuit chip and at least one second integrated chip of the plurality of second integrated circuit chips extend are substantially parallel to a plane along which the circuit board extends.

10. The memory module of claim 9, further comprising a plurality of inter-chip interconnectors, wherein the plurality of second integrated circuit chips includes an upper memory group, disposed on a first side of the first integrated circuit chip, and a lower memory group, disposed on a second side of the first integrated circuit chip, the first and second sides being opposite to each other, wherein the plurality of the inter-chip interconnectors includes an upper penetrating electrode, connecting the first integrated circuit chip with the upper memory group, and a lower penetrating electrode, connecting the first integrated circuit chip with the lower memory group, and wherein the board connector includes a board bonding wire connecting with the circuit board with the interface unit.

11. The memory module of claim 8, wherein the first integrated circuit chip and the plurality of second integrated circuit chips are arranged in a step-like structure.

12. The memory module of claim 11, further comprising a plurality of inter-chip interconnectors, wherein the plurality of second integrated circuit chips includes an upper memory group, disposed on a first side of the first integrated circuit chip, and a lower memory group, disposed on a second side of the first integrated circuit chip, the first and second sides being opposite to each other, wherein the plurality of the inter-chip interconnectors includes an upper bonding wire, connecting the first integrated circuit chip with the upper memory group, and a lower bonding wire, connecting the first integrated circuit chip with the lower memory group, and wherein the board connector includes a board bonding wire, the board bonding wire connecting the circuit board with the interface unit.

13. The memory module of claim 8, wherein planes along which the first integrated circuit chip and at least one second integrated chip of the plurality of second integrated circuit chips extend cross a plane along which the circuit board extends.

14. The memory module of claim 13, further comprising a plurality of inter-chip interconnectors, wherein the second integrated circuit chips include a left memory group, disposed on a first side of the first integrated circuit chip, and a right memory group, disposed on a second side of the first integrated circuit chip, wherein the plurality of the mater-chip interconnectors includes a first penetrating electrode, connecting the first integrated circuit chip with the left memory group, and a second penetrating electrode, connecting the first integrated circuit chip with the right memory group, and wherein the board connector includes a bump structure, the bump structure connecting the circuit board with the interface unit.

15. The memory module of claim 14, wherein the hump structure includes a bump pad and a conductive bump connected to the bump pad, wherein the bump structure is interposed between the first integrated circuit chip and the plurality of second integrated circuit chips, and wherein the hump structure is connected to the interface unit.

16. A memory module comprising:
a circuit board including a first surface, a second surface opposite to the first surface, at least one conductive pattern penetrating the circuit board between the first and second surfaces, and a contact terminal disposed on the second surface, wherein the contact terminal is connected to an external circuit and to the at least one conductive pattern;
a semiconductor memory device disposed on the first surface of the circuit board, the semiconductor memory device including a plurality of integrated circuit chips; and
a memory controller disposed on the circuit board and controlling an operation of the semiconductor memory device,
wherein the semiconductor memory device includes:
a memory structure including the plurality of integrated circuit chips, wherein the plurality of integrated circuit chips includes a first integrated circuit chip and a plurality of second integrated circuit chips stacked on each other, wherein the first integrated circuit chip is interposed between a pair of the plurality of second integrated circuit chips;
an interface unit disposed on the first integrated circuit chip, wherein the memory structure is connected to the external circuit through the interface unit, and wherein the interface unit transfers operation signals to the first integrated circuit chip and the plurality of second integrated circuit chips;
at least one inter-chip interconnector connected with the interface unit and the first and the second integrated circuit chips; and
a board connector connected with the interface unit and the circuit board such that operation signals between the memory structure and the circuit board pass through the board connector.

17. The memory module of claim 16, further comprising a first pad disposed on the first integrated circuit chip and a second pad disposed on the first surface of the circuit board, wherein the board connector includes a wire connected to the first and second pads.

18. The memory module of claim 17, wherein the first pad is disposed at an edge of the first integrated circuit chip.

19. The memory module of claim 16, further comprising a plurality of inter-chip interconnectors, wherein, when the first integrated circuit chip includes a first side and a second side opposite to the first side, the plurality of second integrated circuit chips includes a first group of chips, disposed on the first side of the first integrated circuit chip, and a second group of chips, disposed on the second side of the first integrated circuit chip, wherein the first group of chips is connected to the first integrated circuit chip through a first inter-chip interconnector of the plurality of inter-chip interconnectors, and wherein the second group of chips is connected to the first integrated circuit chip through a second inter-chip interconnector of the plurality of inter-chip interconnectors.

20. The memory module of claim 19, wherein the first inter-chip interconnector penetrates the first group of chips, and the second inter-chip interconnector penetrates the second group of chips.

* * * * *